United States Patent
Brown

(10) Patent No.: US 6,310,506 B1
(45) Date of Patent: *Oct. 30, 2001

(54) PROGRAMMABLE SETUP/HOLD TIME DELAY NETWORK

(75) Inventor: David R. Brown, Sugar Land, TX (US)

(73) Assignee: Texas Instruments Incorporated, Dallas, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/948,900

(22) Filed: Oct. 10, 1997

(51) Int. Cl.[7] .................................................. H03H 11/26
(52) U.S. Cl. ........................... 327/284; 327/276; 327/525
(58) Field of Search ................................... 327/276–278, 327/284, 285, 288, 281, 525, 198, 199, 141, 142; 326/94; 365/225.7, 96

(56) References Cited

U.S. PATENT DOCUMENTS

| 4,687,951 | * | 8/1987 | McElroy | 327/291 |
|---|---|---|---|---|
| 4,894,791 | * | 1/1990 | Jiang et al. | 327/278 |
| 5,428,311 | * | 6/1995 | McClure | 327/276 |
| 5,459,423 | * | 10/1995 | Nozawa et al. | 327/277 |
| 5,486,783 | * | 1/1996 | Baumert et al. | 327/147 |
| 5,550,499 | * | 8/1996 | Eitrheim | 327/291 |
| 5,619,148 | * | 4/1997 | Guo | 327/3 |
| 5,621,335 | * | 4/1997 | Andresen | 327/170 |
| 5,621,774 | * | 4/1997 | Ishibashi et al. | 375/371 |
| 5,652,530 | * | 7/1997 | Ashuri | 326/93 |
| 5,726,585 | * | 3/1998 | Kim | 327/525 |
| 5,726,990 | * | 3/1998 | Shimada et al. | 370/536 |
| 5,923,198 | * | 7/1999 | Fujioka | 327/262 |
| 5,940,330 | * | 8/1999 | Kim | 356/189.05 |
| 5,994,933 | * | 11/1999 | Yamanaka et al. | 327/158 |

* cited by examiner

Primary Examiner—Timothy P. Callahan
Assistant Examiner—Quan Tra
(74) Attorney, Agent, or Firm—Frank D. Cimino; W. James Brady; Frederick J. Telecky, Jr.

(57) ABSTRACT

A system and method for providing a programmable delay to an input signal in a device requiring setup and hold times for input signal, such as a DRAM device. In one embodiment, the programmable delay network 5 comprises a plurality of delay devices and at least one fuse connected between the input of the delay network 5 and the output of the delay network 5. Each fuse can connect in series with at least one delay device in such a manner that opening a fuse, or a combination of fuses, changes the amount of delay time the input signal experiences through the delay network.

67 Claims, 1 Drawing Sheet

PROGRAMMABLE SETUP/HOLD TIME DELAY NETWORK

TECHNICAL FIELD OF THE INVENTION

The present invention relates generally to electronic devices, and more particularly, to a programmable time delay network for use with semiconductor devices requiring signal delays.

BACKGROUND OF THE INVENTION

Semiconductor device technology continues to rapidly advance in the area of devices requiring setup and hold times for input signals. Specifically, dynamic random access memory (DRAM) technology has developed recently to reduce the dissociation of the operation speed between the microprocessor unit of the computer and the DRAM. In a DRAM, a predetermined clock signal is supplied to a clock input terminal. Synchronizing with this predetermined clock signal allows direct contact operation between the DRAM and the microprocessor.

High speed semiconductor parts necessitate relatively tight setup and hold time specifications for DRAMs. Due to the increasing operational speed of DRAMs, a relatively short setup/hold time window exists during which to sample an input signal (e.g., a row or column address strobe signal) in a DRAM. For example, a DRAM for a 125 MHZ microprocessor can have a 2 ns setup time and a 1 ns hold time specification. The inherent time delays in the circuit can cause the rising edge of a clock signal (or latching signal) to miss the setup/hold time window in the input signal, thus failing to enable the DRAM. Building a delay into the path traveled by the input signal can help delay the input signal to allow enough time for the clock signal to travel through the circuit.

Conventional DRAMs do not include any delay mechanism or delay circuit that can be adjusted after fabrication of the device to alter the amount of time the input signal is delayed. Therefore, these conventional DRAMs cannot adjust the setup/hold times to move the setup/hold time window to a point that can be utilized after the device is fabricated. This lack of ability to adjust the delay in the input signal path can result in fabrication of inoperable devices because of the relative difficulty in predicting the location of the input signal setup/hold time window prior to fabricating the device. Furthermore, as the speed of operation increases, the setup/hold time window will become increasing smaller, resulting in a greater number of inoperable devices.

SUMMARY OF THE INVENTION

The present invention provides a programmable setup/hold time delay system and method that substantially eliminates or reduces disadvantages and problems associated with previously developed setup/hold time delay systems and methods.

More specifically, the present invention provides a system for subjecting an input signal going to a DRAM to a programmable delay. The programmable delay network can comprise at least one delay device connected with at least one time delay adjustment mechanism. The time delay adjustment mechanism(s) (for example, a fuse) can connect to the delay device(s) in such a manner that opening a fuse, or a combination of fuses, changes the amount of delay time the input signal experiences through the delay network.

In one embodiment, the programmable delay network can comprise at least one metal plate capacitor. A portion of the metal plate capacitor can be removed in order to change the amount of delay time the input signal experiences through the delay network.

The present invention provides an important technical advantage with an adjustable time delay network that can be programmed to subject the input signal to varying time delays after fabrication of the device. The present invention allows the setup/hold time window to be adjusted after a DRAM device has been built.

The present invention provides another technical advantage by increasing the yield of devices, including DRAM devices.

The present invention provides yet another technical advantage by providing a solution to the problem of using DRAMS with increasingly smaller setup/hold time windows. The adjustable time delay of the present invention can reduce the difficulty of sampling the input signal at the appropriate time as the setup/hold times decrease in faster generations of DRAM devices.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGUREs, like numerals being used to refer to like and corresponding parts of the various drawings.

The present invention provides a system and method for adjusting the setup/hold time window of a delay network for use with a device, for example a DRAM. The delay network can comprise a plurality of delay devices connected in series by at least one time delay adjustment mechanism (for example, a fuse) in the path of the input signal. By opening different fuses, a different time delay is introduced into the path traveled by the input signal. After manufacture of the DRAM, the appropriate fuse can be opened to apply the correct time delay to the input signal. The adjustable time delay of the present invention allows positioning the setup/hold time window to a usable position by subjecting the input signal to an appropriate time delay to ensure proper operation of the DRAM. The programmable delay network of the present invention provides a post-wafer processing system and method for adjusting the amount of delay time incorporated into the input signal path.

Figure 1A:
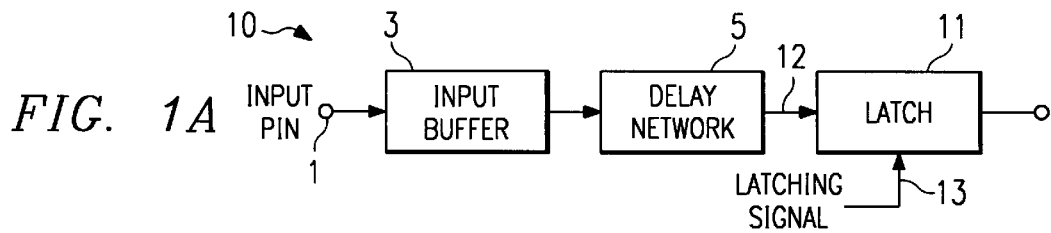
FIG. 1A shows one input path having an embodiment of the delay network of the present invention in the path after an input buffer.
Figure 1B:
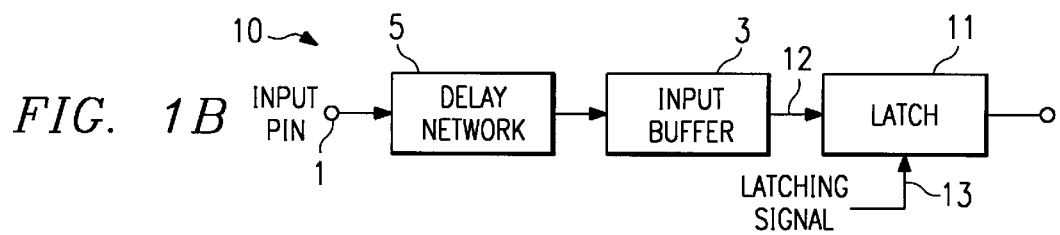
FIG. 1B shows an alternative input path having an embodiment of the delay network of the present invention in the path prior to an input buffer.

FIGS. 1A and 1B show two input signal paths 10 that could exist to a DRAM. FIG. 1A shows an input signal path 10 beginning at input pin 1, first connected to input buffer 3, then connected to the delay network 5 of the present invention, and finally connected to latch 11. The delay network 5 comprises a plurality of delay devices (as described more fully below). FIG. 1B shows a similar input path 10 where the delay network 5 precedes the input buffer 3, and connects to latch 11. In both input paths of FIGS. 1A and 1B, an input signal 12 would originate at the input pin, travel through the input buffer 3 and the delay network 5 (or visa versa), and continue to the latch 11.

Figure 2:
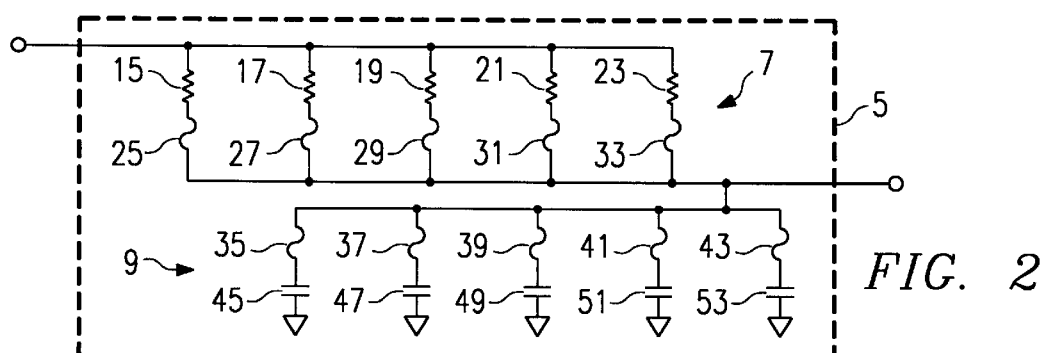
FIG. 2 shows an embodiment of the present invention comprising a resistor/capacitor delay network.

FIG. 2 shows one embodiment of the delay network 5 of FIGS. 1A and 1B comprising a resistor/capacitor (RC) network 5 comprising resistor network 7 and capacitor network 9. As illustrated in FIGS. 1A and 1B, the RC delay network 5 could be placed before or after the input buffer 3. FIG. 2 depicts a method to configure the resistor network 7 and the capacitor network 9 in the RC network 5. More specifically, the RC delay network 5 of FIG. 2 comprises five parallel resistors 15, 17, 19, 21, and 23 in series with five parallel capacitors 35, 37, 39, 41, and 43. Each resistor and each capacitor associates with a time delay adjustment mechanism comprising a fuse. For the embodiment shown in FIG. 2, resistor 15 connects to fuse 25, resistor 17 connects to fuse 27, resistor 19 connects to fuse 29, resistor 21 connects to fuse 31, resistor 23 connects to fuse 33, capacitor 45 connects to fuse 35, capacitor 47 connects to fuse 37, capacitor 49 connects to fuse 39, capacitor 51 connects to fuse 54, and capacitor 53 connects to fuse 43. Opening any combination of the fuses 25–33 will increase the delay network 5 resistance, while opening any combination of the fuses 35–43 will decrease the delay network 5 capacitance. Opening one or more of the fuses allows the time delay through the RC time delay network 5 to be varied.

It should be understood that a five resistor, five capacitor RC delay network 5 is merely illustrative. The RC delay network 5 could comprise unequal numbers of capacitors and resistors, and could include a different number of delay components. It should be further understood that the parallel resistor network 7 in series with the parallel capacitor network 9 is also illustrative and other circuit configurations could be used to adjust the RC time constant to induce a time delay into the input path.

The embodiment of the RC delay network 5 shown in FIG. 2 also depicts fuses associated with each resistor and capacitor. It should be understood however, that the RC delay network 5 can provide a programmable delay network when the RC delay network 5 comprises anywhere from a single fuse, to a fuse associated with each resistor and each capacitor. Having a fuse associated with each resistor and capacitor merely enhances the ability to precisely position the setup/hold time window (by providing a larger number of RC value combinations to be chosen, thereby increasing the number of time delays that the input signal can be subjected to). The RC delay network 5 must contain at least one fuse to enable programming (i.e., adjusting) the time delay of the input signal through the RC delay network 5. Furthermore, when programming the time delay, any combination of fuses can be opened in the RC delay network 5 embodiment, as long as one path through the RC delay network remains after opening the fuse(s).

The resistors and capacitors of the RC delay network 5 should have predetermined values to allow more precise determination of which fuse to open to provide the correct amount of delay in the input path 10. It should be understood that the resistor and capacitor values can be changed to provide varying delay times depending upon the application. Additionally, a particular device may only require a network of resistors without any capacitors, or alternatively, a network of capacitors without any resistors.

The RC network 5 of FIG. 2 provides one method for positioning the setup/hold time window by opening (for example by cutting with a laser) one or more of the fuses in the RC network 5. After manufacture of the device including the RC delay network 5, the position of the setup/hold time window can be determined during preliminary testing. If the setup/hold time window of the input signal 12 does not coincide with the rising edge of the latching signal 13 at the latch 11, the RC time constant of the RC delay network 5 can be adjusted by opening the appropriate fuse(s) in the RC delay network 5. Any combination of fuses can be opened, provided that at least one path remains for the input signal to exit the RC delay network 5. Opening one or more of the fuses will adjust the amount of time the input signal 12 will be delayed when traveling through the RC delay network 5. Opening the correct combination of fuses will subject the input signal 12 to a known delay to allow the latching signal 13 to arrive at the latch when the setup/hold time window of the input signal 12 is useable. This programmable time delay feature can also be used to compensate for variations in the resistor network 7 and capacitor network 9, and for variations in the speed of the input buffer 3 and the latching signal 13.

An alternative method of implementing the RC delay network 5 on a semiconductor device involves building a metal level capacitor into the input path 10. In a DRAM having metal line capacitors in the delay network 5, the delay time through the RC delay network 5 could be adjusted by removing part of the metal capacitor. In this embodiment, the metal line capacitor serves as the time delay adjustment mechanism.

Figure 3:
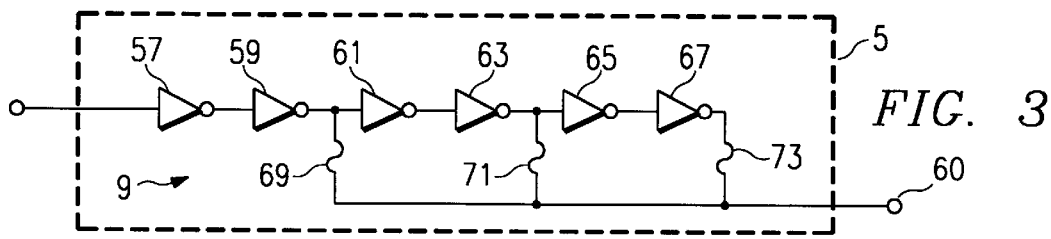
FIG. 3 shows an alternative embodiment of the present invention comprising an inventor chain delay network.

Another embodiment of the delay network 5 of the present invention comprises an invertor chain having a plurality of invertors connected in series and having at least two fuses with at least one fuse between two of the invertors. The fuses can be opened in any combination to provided a single path through the delay network 5 in order to change the delay through the inverter chain. FIG. 3 shows one implementation of an invertor chain delay network 5 comprising six invertors 57–67 with fuse 69 between invertors 59 and 61, fuse 71 between invertors 63 and 65, and fuse 73 between invertor 67 and output 60.

Opening any two of the three fuses 69, 71, 73 will set the time delay through the invertor chain delay network 5. For example, in the embodiment of FIG. 3, opening fuses 69 and 71 will provide a six invertor time delay network 5, opening fuses 69 and 73 will result in a four invertor time delay network 5, and opening fuses 71 and 73 will result in a two invertor time delay network 5. It should be understood that the number of invertors, the number of fuses, and the invertor value can be increased or decreased as necessary to accommodate the technology operational speed. Invertor chain delay network 5 embodiments similar to that shown in FIG. 3 require opening all but one of the fuses in order to provide a single path through the delay network 5. The invertor chain delay network 5 can provide a finer resolution than the RC delay network 5 when the input pin does not switch rail to rail.

Figure 4:
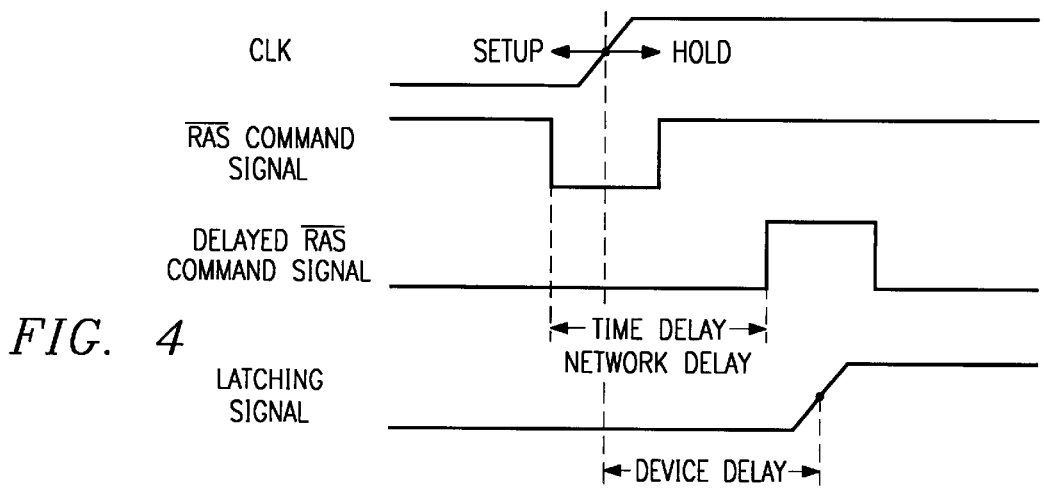
FIG. 4 shows an exemplary timing diagram of several signals that could be present during DRAM operation and incorporating the present invention.

FIG. 4 is a timing diagram showing the implementation of a delay network 5 with a device such as a DRAM. The clock signal (CLK) and the row address strobe (RAS) command signal initiate to the DRAM synchronously as shown in the timing diagram of FIG. 4. The clock signal includes a setup time and a hold time that define the active period of the input signal (i.e., the setup/hold time window). As shown in FIG. 4, the setup time consists of half of the period of the rising edge plus a specified time prior to the rising edge of the clock signal (for example, two nanoseconds. The hold time consists of half of the period of the rising edge plus a specified hold period after the rising edge of the clock signal (for example, one nanosecond).

With reference to FIGS. 1A and 1B, the RAS command signal (the input signal) travels though the delay network 5 prior to reaching the latch 11. The clock signal travels through a different path prior to arriving at the latch 11 as the latching signal 13. In order to function, the rising edge of the latching signal 13 must occur within the setup/hold time window of the input signal 12 (the RAS command signal in the example of FIG. 4). As shown in FIG. 4, if the RAS command signal 12 is not delayed for an appropriate period of tine, the setup/hold time window can occur at the latch prior to the rising edge of the latching signal 13 due to the delay the clock signal experiences through the device. Sending the RAS command signal 12 through the delay network 5 repositions the setup/hold time window by delaying the RAS command signal 12.

The programmable delay network 5 of the present invention allows the amount of time the delay network delays the RAS command signal (or any other input signal) to be adjusted after manufacturing of the delay network 5. This allows the delay the input signal experiences to be adjusted (programmed) so that the setup/hold time window occurs coincidentally with the rising edge of the latching signal 13, thus allowing operation of the DRAM.

In manufacturing a DRAM device, current operational speeds require a relatively tight input signal setup/hold time window (on the order of 2–3 nanoseconds on current technologies) during which the latching signal rising edge must occur in order for the DRAM to operate. The inaccuracies associated with semiconductor device manufacture (such as changes in parasitics) make determining the beginning and end of the setup/hold time window difficult. Furthermore, manufacturing a fixed delay device within the input signal path can result in positioning the setup/hold time window outside the rising edge of the latching signal. The present invention provides a programmable delay network that provides an adjustable time delay device. The DRAM can be built and tested to determine when the rising edge of the latching signal reaches the latch. The amount of delay the input signal experiences can be adjusted so that the setup/hold time window of the input signal occurs coincidentally with the rising edge of the latching signal at the latch. The present invention overcomes the problem of missing the setup/hold window due to 1) tight specifications and 2) manufacturing inaccuracies by providing a programmable delay network that can be adjusted to induce varying delays into the input signal. This allows the setup/hold time window to occur during a rising edge of the latching signal.

In summary, the present invention provides a system and method for providing a programmable delay to an input signal to a DRAM. In one embodiment, the programmable delay network comprises at least one delay device connected with at least one time delay adjustment mechanism. The time delay adjustment mechanism, for example a fuse, is connected in such a manner that opening a fuse, or a combination of fuses, changes the amount of delay time the input signal experiences through the delay network. The programmable delay network of the present invention provides a post-manufacture method of positioning the setup/hold time window of the input signal to allow functioning of the DRAM.

Although the present invention has been described in detail, it should be understood that various changes, substitutions and alterations can be made hereto without departing from the spirit and scope of the invention as described by the appended claims.

What is claimed is:

1. A signal latching apparatus for an integrated circuit, comprising:

an input buffer connected to an input pin of the integrated circuit and operable to receive an externally applied input signal having a setup/hold time window from the input pin;

a latching device operable to latch a signal at its input in response to an edge of a latching signal; and a delay network coupled to the input buffer and the latching device and operable to delay the input signal, the delay network comprising:

a plurality of delay devices through which the input signal travels; and at least one fuse connected to at least one of the plurality of delay devices such that opening the fuse changes the amount of delay time the input signal experiences through the delay network such that the setup/hold time window of the delayed input signal at the input of the latching device coincides with the edge of the latching signal.

2. The apparatus of claim 1, wherein the delay devices include at least one resistor.

3. The apparatus of claim 2, wherein the at least one delay device comprises:

a resistor network comprising a plurality of resistors connected in parallel; and a capacitor network comprising a plurality of capacitors connected in parallel, the capacitor network connected in series to the resistor network;

and further wherein the at least one fuse comprises a plurality of fuses equal to the number of delay devices in the delay network, each fuse connected in series to one of the delay devices such that opening a particular fuse removes the delay device connected to that particular fuse from the delay network to change the amount of delay time the input signal experiences due to the delay network.

4. A programmable method for latching an input signal to a DRAM, the method comprising:

manufacturing a DRAM;

building a delay network into the DRAM to delay the input signal during operation;

programming the delay network to adjust the amount of time the delay network delays the input signal so that the input signal coincides with an edge of a latching signal at a latch allowing the input signal to be latched in response to the edge of the latching signal.

5. The method of claim 4, wherein building a delay network further comprises building a resistor/capacitor delay network for delaying the input signal.

6. The method of claim 4, wherein building a delay network further comprises building a plurality of resistors and a plurality of capacitors coupled to the plurality of resistors, and wherein the plurality of resistors are connected in parallel with one another and the plurality of capacitors are connected in parallel with one another.

7. The method of claim 4, wherein building a delay network further comprises building an inverter chain delay network into the DRAM.

8. The method of claim 4, further comprising;
building at least one fuse into the delay network.

9. The method of claim 4, wherein building a delay network further comprises building at least one metal plate capacitor into the DRAM, and wherein programming the delay network further comprises removing a portion of at least one of the metal plate capacitors.

10. The method of claim 4, wherein building a delay network further comprises building a plurality of delay devices connected in series with a plurality of fuses, and wherein programming the delay network further comprises opening any combination of fuses that maintains a path through the delay network to position the input signal setup/hold time window to occur at the latch coincidentally with the rising edge of the latching signal.

11. The method of claim 4, wherein the step of programming the delay network is performed after fabrication of the DRAM and prior to packaging of the DRAM.

12. The method of claim 4, wherein building the delay network further comprises building at least one resistor.

13. The method of claim 4, wherein building the delay network further comprises building at least one capacitor.

14. The method of claim 4, wherein the input signal is a row address strobe signal.

15. Programmable input signal delay apparatus for an integrated circuit comprising:
a latch circuit having an input, the latch circuit receiving an input signal at its input and latching the input signal in response to an edge of a latch signal, the input signal having a setup/hold time window from an input terminal of the integrated circuit; and
a delay network having and input and an output, the output of the delay network coupled to the input of the latch circuit, the delay network comprising:
at least one delay device coupled to the path through which the input signal travels, the at least one delay device operable to delay the time required for the input signal to arrive at the latch circuit; and
at least one time delay adjustment mechanism, comprising at least one fuse, coupled to the at least one delay device, and wherein the time delay adjustment mechanism is operable to change the amount of delay time the input signal experiences through the delay network such that the setup/hold time window of the input signal at the input of the latch circuit coincides with the edge of the latch signal.

16. The at least one time delay adjustment mechanism of claim 15, wherein the delay experienced by the input signal can be adjusted after fabrication of the integrated circuit and before packaging of the integrated circuit.

17. The programmable input signal delay apparatus of claim 15, wherein the at least one delay device comprises at least one resistor.

18. The programmable input signal delay apparatus of claim 17, wherein the at least one time delay adjustment mechanism comprises the at least one fuse connected in series with the at least one resistor.

19. The programmable input signal delay apparatus of claim 15, wherein the at least one delay device comprises at least one capacitor.

20. The programmable input signal delay apparatus of claim 19, wherein the delay associated with the at least one capacitor can be adjusted by removing part of one plate of the metal capacitor.

21. The programmable input signal delay apparatus of claim 19, wherein the at least one time delay adjustment mechanism comprises the at least one fuse connected in series with the at least one capacitor.

22. The programmable input signal delay apparatus of claim 15, wherein the at least one delay device comprises at least one inverter.

23. The programmable input signal delay apparatus of claim 22, wherein the at least one time delay adjustment mechanism comprises the at least one fuse connected between the input of the at least one inverter and the output of the delay network.

24. The programmable input signal delay apparatus of claim 15, wherein the input signal is a row address strobe signal and the integrated circuit is a DRAM.

25. Programmable input signal delay apparatus for an integrated circuit comprising:
an input buffer having an input and an output, the input buffer connected to an input pin of the integrated circuit and receiving an input signal externally applied to the input pin of the integrated circuit and providing a buffered input signal at its output, the input signal having a setup/hold time window at the input pin of the integrated circuit;
a delay circuit having an input and an output, and comprising a time delay adjustment mechanism to adjust the delay associated with the delay circuit, the input of the delay circuit being coupled to the output of the input buffer such that the delay circuit receives the buffered input signal from the input buffer and delays the time required for the buffered input signal to propagate from the input of the delay circuit to the output of the delay circuit; and
a latch circuit having an input coupled to the output of the delay circuit and receiving the delayed buffered the setup/hold time of the delayed buffered input signal at the input of the latch circuit coinciding with the edge of a latch signal such that the latch circuit latches the delayed buffered input signal in response to the edge of the latch signal.

26. The programmable input signal delay apparatus of claim 25 wherein the time delay adjustment mechanism is programmable after fabrication of the integrated circuit but before packaging of the integrated circuit.

27. The programmable input signal delay apparatus of claim 25, wherein the time delay adjustment mechanism is connected to the path through which the buffered input signal travels.

28. The programmable input signal delay apparatus of claim 25, wherein the time delay adjustment mechanism is connected in series with a delay device.

29. The programmable input signal delay apparatus of claim 25, wherein the time delay adjustment mechanism comprises a fuse.

30. The programmable input signal delay apparatus of claim 25, wherein the delay circuit further comprises a resistor.

31. The programmable input signal delay apparatus of claim 30, wherein the time delay adjustment mechanism comprises a fuse.

32. The programmable input signal delay apparatus of claim 25, wherein the delay circuit further comprises a capacitor.

33. The programmable input signal delay apparatus of claim 32, wherein the time delay adjustment mechanism comprises a fuse.

34. The programmable input signal delay apparatus of claims 25, wherein the input signal is a row address strobe signal and the integrated circuit is a DRAM.

35. Programmable input signal delay apparatus for an integrated circuit comprising:

a latch circuit having an input for receiving a buffered input signal, the latch circuit latching the buffered input signal in response to an edge of a latch signal; and a delay network having an input coupled to an input of the integrated circuit and an output, the delay network receiving an input signal applied to the input of the integrated circuit, the delay network comprising:

at least one delay device coupled to the path through which the input signal travels, the at least one delay device operable to delay the time required for the input signal to propagate from the input of the delay circuit to the output of the delay circuit; and at least one time delay adjustment mechanism coupled to the at least one delay device; and an input buffer having an input coupled to the output of the delay network and an output, the input buffer receiving the input signal at its input and providing the buffered input signal at its output.

36. The at least one time delay adjustment mechanism of claim 35, wherein the delay experienced by the input signal can be adjusted after fabrication of the integrated circuit and before packaging of the integrated circuit.

37. The programmable input signal delay apparatus of claim 36, wherein the at least one time delay adjustment mechanism comprises at least one fuse.

38. The programmable input signal delay apparatus of claim 35, wherein the at least one delay device comprises at least one resistor.

39. The programmable input signal delay apparatus of claim 38, wherein the at least one time delay adjustment mechanism comprises at least one fuse connected in series with the at least one resistor.

40. The programmable input signal delay apparatus of claim 35, wherein the at least one delay device comprises at least one capacitor.

41. The programmable input signal delay apparatus of claim 40, wherein the delay associated with the at least one capacitor can be adjusted by removing part of one plate of the metal capacitor.

42. The programmable input signal delay apparatus of claim 40, wherein the at least one time delay adjustment mechanism comprises at least one fuse connected in series with the at least one capacitor.

43. The programmable input signal delay apparatus of claim 35, wherein the at least one delay device comprises at least one inverter.

44. The programmable input signal delay apparatus of claim 43, wherein the at least one time delay adjustment mechanism comprises at least one fuse connected between the input of the at least one inverter and the output of the delay network.

45. The programmable input signal delay apparatus of claim 35, wherein the input signal is a row address strobe signal and the integrated circuit is a DRAM.

46. The programmable input signal delay apparatus of claim 38, wherein the at least one delay device further comprises at least one capacitor.

47. The programmable input signal delay apparatus of claim 46, wherein the at least one time delay adjustment mechanism comprises at least one fuse.

48. The programmable input signal delay apparatus as in claim 17, wherein the at least one delay device further comprises at least one capacitor coupled to the at least one resistor.

49. The programmable input signal delay apparatus of claim 48, wherein the at least one delay adjustment mechanism comprises at least one fuse.

50. The programmable input signal delay apparatus of claim 31, wherein the delay circuit further comprises a capacitor coupled to the resistor.

51. The programmable input signal delay apparatus of claim 25, wherein the delay circuit comprises at least one inverter.

52. The method of claim 4, wherein the step of manufacturing a DRAM includes manufacturing a synchronous DRAM.

53. The method of claim 52, wherein the step of programming the delay network to adjust the amount of time the delay network delays the input signal so that the input signal coincides with an edge of a latching signal at a latch allowing the input signal to be latched in response to the edge of the latching signal includes allowing the input signal to be latched in response to the edge of a signal derived from a clock input externally to the DRAM.

54. The programmable input signal delay apparatus of claim 15, wherein the integrated circuit is a dynamic random access memory (DRAM).

55. The programmable input signal delay apparatus of claim 54 wherein the latch signal is a clock signal derived from a clock signal input externally to the synchronous DRAM.

56. The programmable input signal delay apparatus of claim 15 wherein the latch signal is a clock signal derived from a clock signal input externally to the integrated circuit.

57. The programmable input signal delay apparatus of claim 25 wherein the integrated circuit is a synchronous DRAM.

58. The programmable input signal delay apparatus of claim 57 wherein the latch signal is a clock signal derived from a clock signal input externally to the synchronous DRAM.

59. The programmable input signal delay apparatus of claim 25 wherein the latch signal is a clock signal derived from a clock signal input externally to the integrated circuit.

60. The programmable input signal delay apparatus of claim 35 wherein the integrated circuit is a synchronous DRAM.

61. The programmable input signal delay apparatus of claim 60 wherein the latch signal is a clock signal derived from a clock signal input externally to the synchronous DRAM.

62. The programmable input signal delay apparatus of claim 35 wherein the latch signal is a clock signal derived from a clock signal input externally to the integrated circuit.

63. The programmable input signal delay apparatus of claim 35, wherein the input of the delay network is connected to an input pin of the integrated circuit and wherein the input signal is received at the input pin of the integrated circuit.

64. The signal latching apparatus of claim 1, wherein the integrated circuit is a DRAM.

65. The signal latching apparatus of claim 1, wherein the integrated circuit is a synchronous DRAM.

66. The signal latching apparatus of claim 1, wherein the latch signal is a clock signal derived from a clock signal input externally to the integrated circuit.

67. The signal latching apparatus of claim 1, wherein the delay devices comprise at least one capacitor.

* * * * *

UNITED STATES PATENT AND TRADEMARK OFFICE
CERTIFICATE OF CORRECTION

PATENT NO. : 6,310,506 B1
DATED : October 30, 2001
INVENTOR(S) : David R. Brown

It is certified that error appears in the above-identified patent and that said Letters Patent is hereby corrected as shown below:

Title page,
Item [60], under Related U.S. Application Data field, insert the following:
-- Provisional application Number 60/030,422, filed on October 29, 1996. --

Column 1,
Line 3, before the first sentence, insert the following:
-- This application claims priority under 35 USC § 119(e)(i) of provisional application number 60/030,422, filed 10/29/1996. --

Column 8,
Line 31, after "the delayed buffered" please insert: -- input signal at its input, --

Signed and Sealed this

Twenty-fifth Day of June, 2002

*Attest:*

*Attesting Officer*

JAMES E. ROGAN
*Director of the United States Patent and Trademark Office*